US012644460B2

(12) United States Patent
Lin et al.

(10) Patent No.: US 12,644,460 B2
(45) Date of Patent: Jun. 2, 2026

(54) ELECTRICAL CONDUCTING PLATE STRUCTURE FOR AXIAL FAN

(71) Applicant: ASIA VITAL COMPONENTS CO., LTD., New Taipei City (TW)

(72) Inventors: Hsu-Jung Lin, New Taipei City (TW); Ting-Yen Chiu, New Taipei City (TW); Yung-Chun Chou, New Taipei City (TW)

(73) Assignee: ASIA VITAL COMPONENTS CO., LTD., New Taipei City (TW)

( * ) Notice: Subject to any disclaimer, the term of this patent is extended or adjusted under 35 U.S.C. 154(b) by 300 days.

(21) Appl. No.: 18/395,381

(22) Filed: Dec. 22, 2023

(65) Prior Publication Data

US 2025/0207600 A1      Jun. 26, 2025

(51) Int. Cl.
*F04D 25/06*          (2006.01)
*F04D 19/00*          (2006.01)
(Continued)

(52) U.S. Cl.
CPC ........... F04D 25/06 (2013.01); F04D 19/002 (2013.01); F04D 25/08 (2013.01); H05K *1/181* (2013.01);
(Continued)

(58) Field of Classification Search
CPC ........ F04D 25/06; F04D 19/002; F04D 25/08; F04D 25/0693; H05K 1/181; H05K 2201/09027; H05K 2201/1028
See application file for complete search history.

(56) References Cited

U.S. PATENT DOCUMENTS

| | | | |
|---|---|---|---|
| 6,710,486 B1 * | 3/2004 | Horng | F04D 29/667 |
| | | | 310/59 |
| 11,761,449 B2 * | 9/2023 | Hsieh | F04D 25/0613 |
| | | | 415/213.1 |

(Continued)

FOREIGN PATENT DOCUMENTS

| | | |
|---|---|---|
| CN | 102996474 B | 12/2015 |
| CN | 217036056 U | 7/2022 |

(Continued)

*Primary Examiner* — Abdullah A Riyami
*Assistant Examiner* — Nader J Alhawamdeh
(74) *Attorney, Agent, or Firm* — Demian K. Jackson; Jackson IPG PLLC

(57)          ABSTRACT

An electrical conducting plate structure for axial fan includes a fan having a frame that internally defines an airflow passage; a base, a plurality of stationary blades, and a plurality of and conductor thin plates provided in the airflow passage; and a circuit board mounted on the base. The stationary blades are extended between and connected to the frame and the base, and the conductor thin plates are located between two adjacent stationary blades to extend across the airflow passage with two ends connected to the circuit board and the fan frame respectively. Since the conductor thin plates respectively have a thin and flat configuration, their upwind area against the airflow flowing through the airflow passage is minimized, which effectively reduces the fluid resistance in the airflow passage and enables upgraded fan static pressure and output air volume and reduced noise possibly produced by the fan in operation.

7 Claims, 10 Drawing Sheets

(51) Int. Cl.
  *F04D 25/08*    (2006.01)
  *H05K 1/181*    (2026.01)

(52) U.S. Cl.
  CPC ............. *H05K 2201/09027* (2013.01); *H05K*
             *2201/1028* (2013.01)

(56)       References Cited

U.S. PATENT DOCUMENTS

| | | | |
|---|---|---|---|
| 2006/0012261 A1* | 1/2006 | Ku | H02K 3/345 |
| | | | 310/67 R |
| 2006/0056965 A1* | 3/2006 | Li | F04D 29/4226 |
| | | | 415/213.1 |
| 2017/0288518 A1* | 10/2017 | Matsuura | H02K 1/146 |
| 2021/0018009 A1* | 1/2021 | Hsieh | F04D 25/0693 |
| 2021/0099043 A1* | 4/2021 | Shiraishi | F04D 29/023 |
| 2022/0115928 A1* | 4/2022 | Lu | H02K 5/225 |
| 2025/0207600 A1* | 6/2025 | Lin | F04D 25/0693 |

FOREIGN PATENT DOCUMENTS

| | | |
|---|---|---|
| TW | M641517 U | 5/2023 |
| TW | M652034 U | 2/2024 |

* cited by examiner

ELECTRICAL CONDUCTING PLATE STRUCTURE FOR AXIAL FAN

FIELD OF THE INVENTION

The present invention relates to the fan field, and more particularly, to an electrical conducting plate structure for axial fan.

BACKGROUND OF THE INVENTION

FIG. 1A shows a prior art axial fan 1, which includes a frame 11 and a circuit board 12. The frame 11 has a retaining slot 111 provided on a wall thereof and located at an air outlet of the axial fan 1 for receiving and organizing a plurality of conductors therein. The frame 11 internally defines an airflow passage 112, in which a base 113 is provided. The circuit board 12 is mounted on one side of the base 113, and a plurality of stationary blades 114 is circumferentially spaced on a peripheral wall of the base 113 with an end connected to the base 113 and another end connected to an inner side of the frame 11, so as to support the base 113 in the airflow passage 112 and guide air flowing through the stationary blades 114 to achieve the effect of rectifying and boosting the airflow.

The circuit board 12 includes a conductor assembly 13 having a plurality of round conductors 131 located between two adjacent stationary blades 114. These round conductors 131 are arranged side by side to extend across the airflow passage 112 to an outer side of the frame 11 and are gathered up and confined in the retaining slot 111 on the frame 11.

Please refer to FIG. 1B. The conventional round conductor 131 includes more than one metal wire enclosed in a rubber insulation material and has a substantially round outer diameter. Conductors for differently sized fans are different in outer diameters. Fans with a larger size should use a conductor assembly 13 containing conductors 131 with a larger outer diameter. For instance, fans from 4 cm×4 cm to 8 cm×8 cm should use the conductor assembly 13 containing round conductors 131 that respectively have an outer rubber insulation material enclosing at least one metal wire therein and have an outer diameter D from about 0.95 mm to 1.08 mm. Therefore, every round conductor 131 would have a relatively large upwind area A1 formed on its outer surface. Further, as shown in FIG. 1C, the round conductors 131 in the conductor assembly 13 are arranged side by side, such that these round conductors 131 together form a further increased upwind area A2. The increased upwind area A2 of the round conductors 131 results in a larger fluid resistance against the air in the airflow passage 112 and the flow of air that can blow out of the frame 11 is largely reduced. Another problem is that the airflow interfered by the round conductors 131 continuously collides with the outer surfaces of the round conductors 131 and the inner side of the frame 11 to produce undesired noise.

Please refer to FIGS. 1D and 1E. In the prior art axial fan 1, the round conductors 131 of the conductor assembly 13 are gathered up and confined in the retaining slot 111 on the frame 11. However, the retaining slot 111 is provided only to gather up and confine the round conductors 131. In the process of assembling or using the conductor assembly 13, the round conductors 131 tends to become loosened from or slipped off the retaining slot 111 when they are undesirably touched, pushed by foreign matters, or displaced by the airflow flowing through them. When the airflow continuously flows through the round conductors 131 that are loosened from or slipped off the retaining slot 111, fluid resistance and noise would occur to interfere with and adversely affect adjoining or nearby elements, such as the circuit board or another axial fan serially connected thereto. In a worse condition, unexpected damages to the fan 1 might occur.

It is therefore tried by the inventor to develop an improved electrical conducting plate structure for axial fan to overcome the problems in the prior art axial fans.

SUMMARY OF THE INVENTION

A primary object of the present invention is to provide an electrical conducting plate structure for axial fan, in order to solve the problems in the prior art axial fans.

Another object of the present invention is to provide an electrical conducting plate structure for axial fan, in which a set of conductor thin plates is used in place of the conventional round conductors that have a relatively large outer diameter and a very large upwind area. The conductor thin plates have reduced upwind areas to reduce the fluid resistance and the airflow loss in an airflow passage of the axial fan. Therefore, the electrical conducting plate structure of the present invention enables an axial fan to have largely upgraded fan static pressure and output air volume and largely reduced the noise produced during fan operation.

To achieve the above and other objects, the electrical conducting plate structure of the present invention includes an axial fan having a frame, which internally defines an airflow passage. The frame has two ends respectively being an upper open end and a lower open end communicable with the airflow passage. The airflow passage is internally provided with a base having a circuit board mounted on one side thereof, a plurality of stationary blades, and a plurality of conductor thin plates. The stationary blades are circumferentially spaced from one another and are respectively connected at two ends to the frame and the base. The conductor thin plates are located between two adjacent stationary blades to extend across the airflow passage. Each of the conductor thin plates has an inner end electrically connected to the circuit board, an outer end extended to the frame, and a thin and flat upwind side located between the inner and the outer end of the fan.

Since the conductor thin plates according to the electrical conducting plate structure of the present invention respectively have a thin and flat configuration, the area of their upwind side against the air flowing through the airflow passage is minimized to effectively reduce the airflow resistance in the airflow passage, allowing the airflow to flow through the airflow passage more smoothly without impacting on the airflow passage. With these arrangements, the static pressure and the output air volume of the fan can be increased and the noise produced during fan operation can be reduced.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
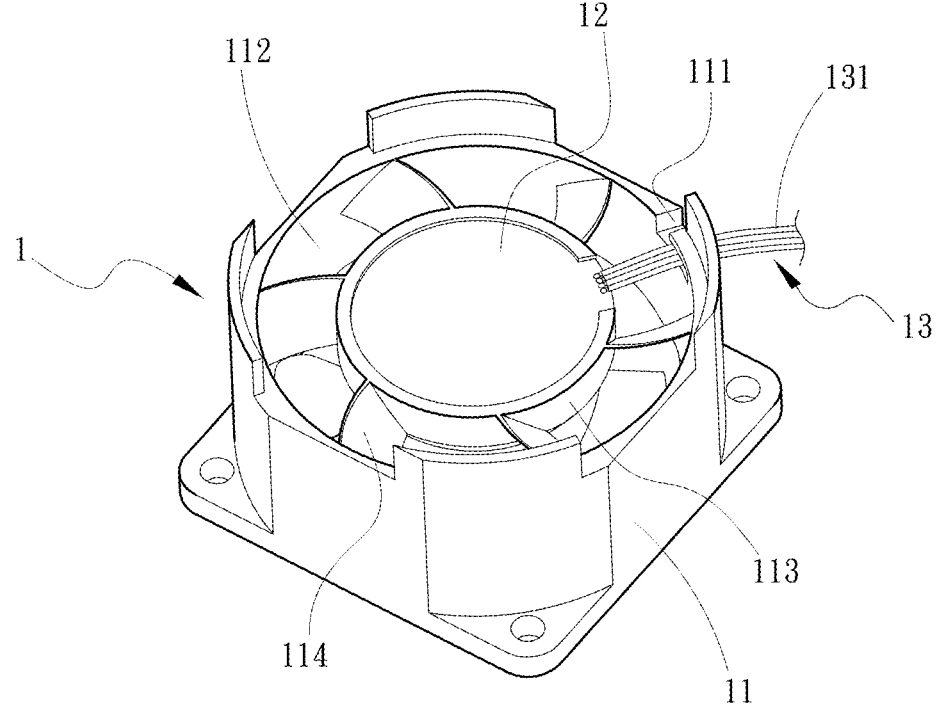
FIGS. 1A through 1E show a prior art axial fan and electrical conductors thereof.
Figure 1B:
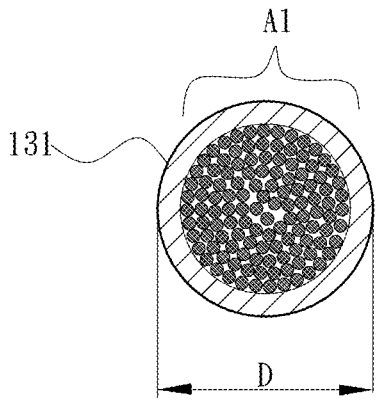
Figure 1C:
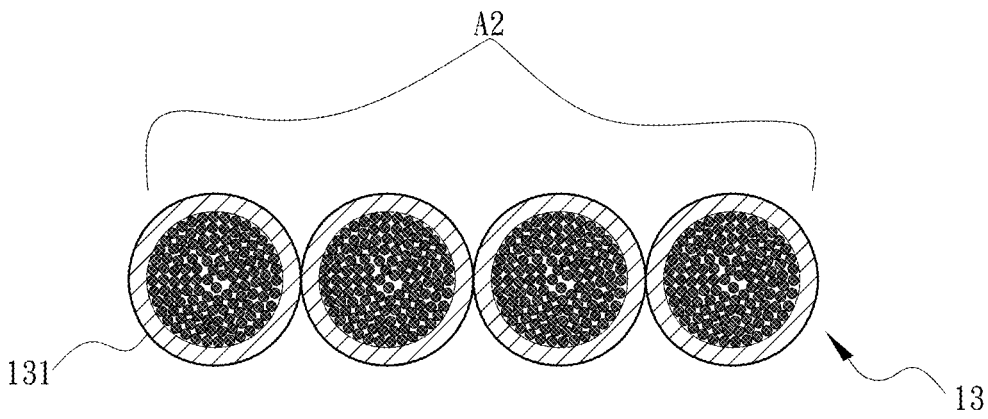
Figure 1D:
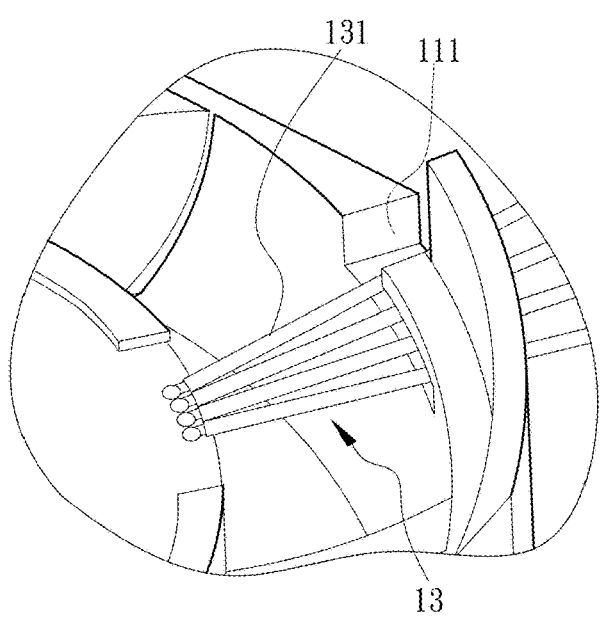
Figure 1E:
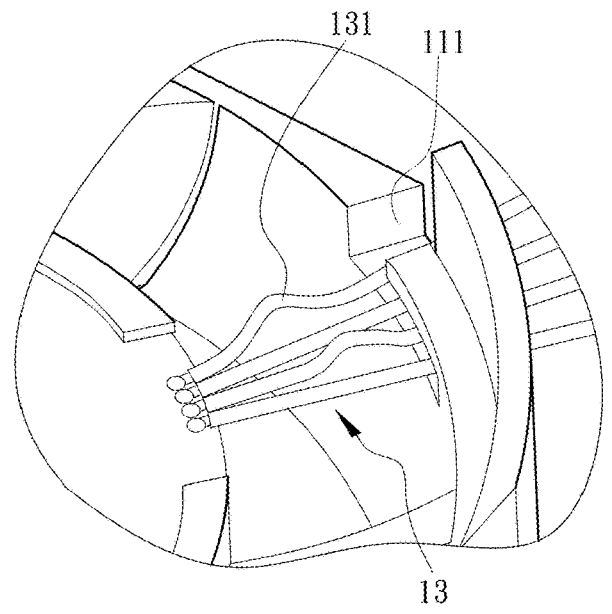

The present invention will now be described with some preferred embodiments thereof. For the purpose of easy to understand, elements that are the same in the preferred embodiments are denoted by the same reference numerals.

Figure 2:
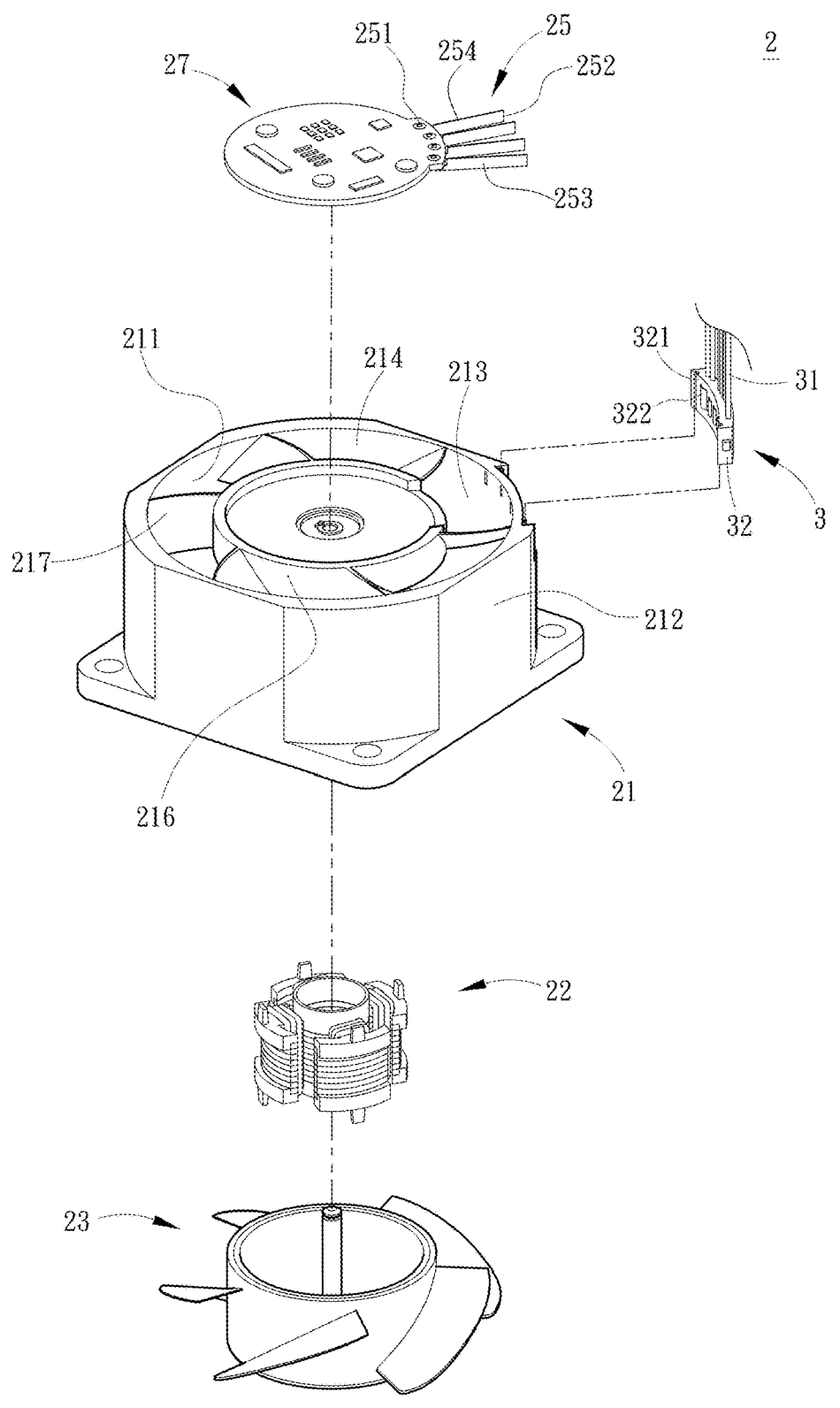
FIG. 2 is an exploded perspective view of an axial fan and an electrical conducting plate structure thereof according to a preferred embodiment of the present invention.
Figure 3A:
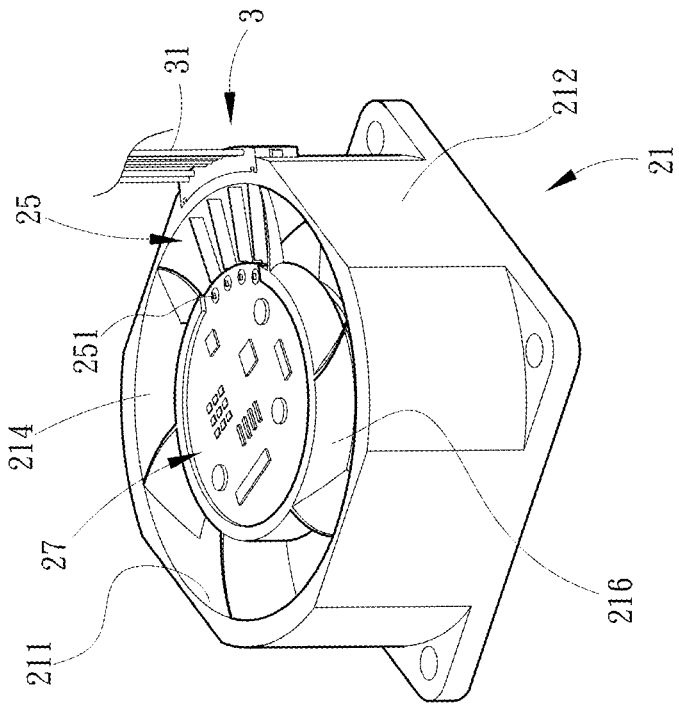
FIG. 3A is an assembled perspective view of FIG. 2.
Figure 3B:
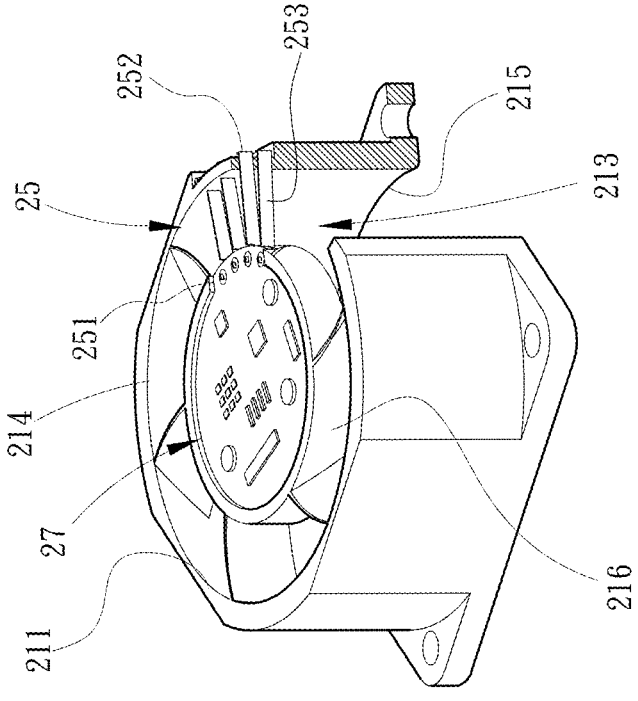
FIG. 3B is a cutaway view of FIG. 3A showing a frame, a circuit board and a plurality of conductor thin plates of the axial fan according to the present invention.
Figure 3C:
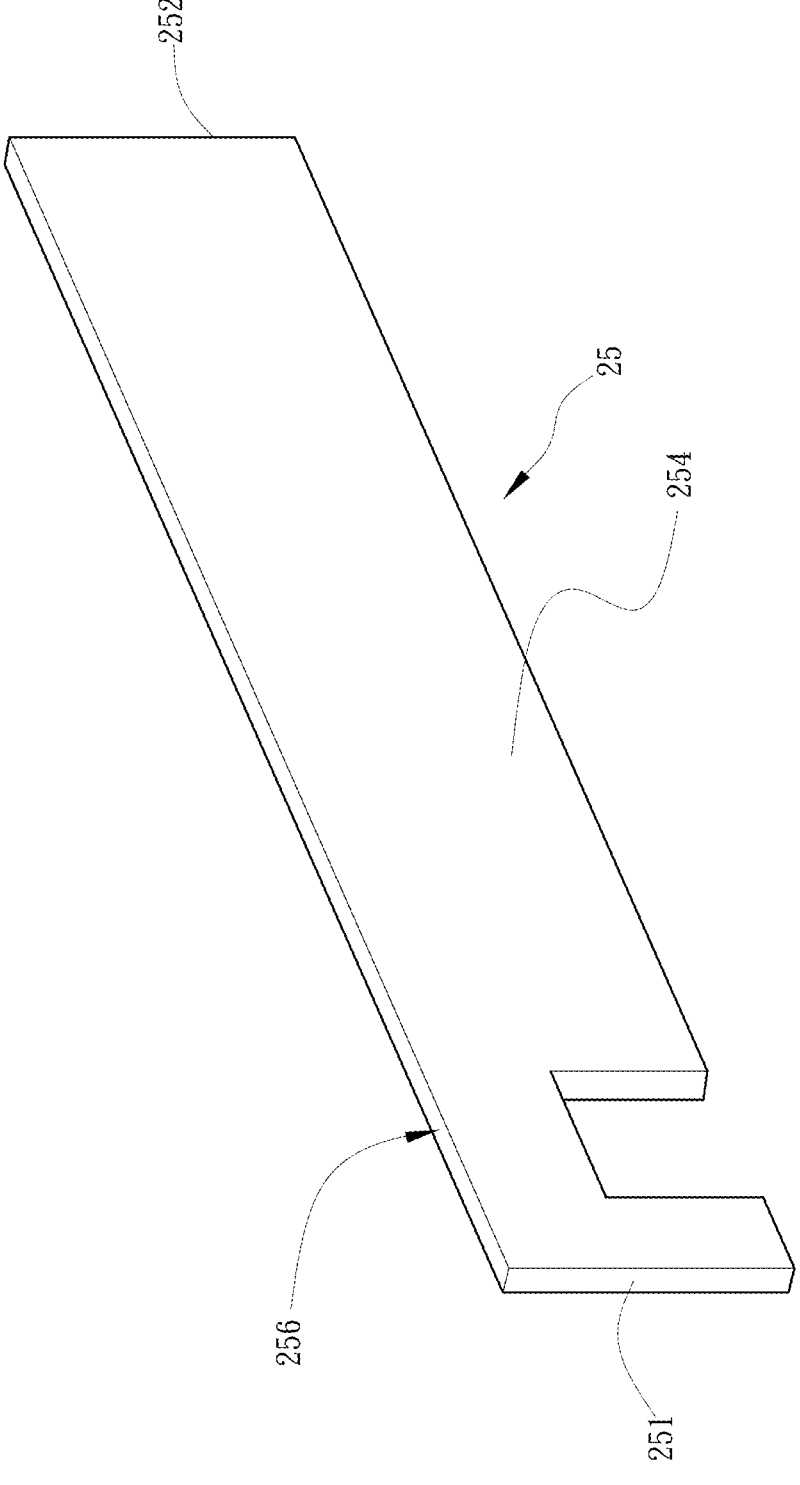
FIG. 3C is a perspective view of a conductor thin plate for the electrical conducting plate structure according to the present invention.
Figure 4:
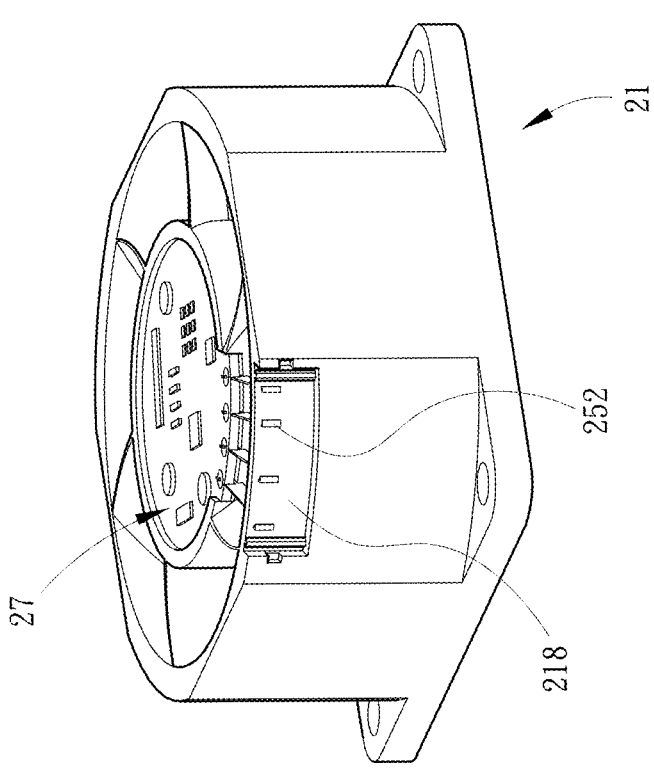
FIG. 4 shows every conductor thin plate according to the present invention has a radially outer end that forms a metal contact on an outer side of the fan frame.

Please refer to the accompanying drawings, wherein FIGS. 2 and 3A are exploded and assembled perspective views, respectively, of an axial fan 2 and an electrical conducting plate structure thereof according to a preferred embodiment of the present invention; FIG. 3B is a cutaway view of FIG. 3A showing a frame 21, a circuit board 27 and a plurality of conductor thin plates 25 of the axial fan 2 according to the present invention; FIG. 3C is a perspective view of the conductor thin plate 25 for the electrical conducting plate structure according to the present invention; FIG. 4 shows every conductor thin plate 25 according to the present invention has a radially outer end 252 that forms a metal contact on an outer side 212 of the frame 21.

The frame 21 of the axial fan 2 has an inner side 211 and an outer side 212. The inner side 211 of the frame 21 defines an airflow passage 213 in the frame 21. Further, the frame 21 has two open ends, i.e. an upper open end 214 and a lower open end 215 (see FIG. 3B), which are communicable with the airflow passage 213.

The airflow passage 213 is internally provided with a base 216, a plurality of stationary blades 217, a plurality of conductor thin plates 25, a stator 22, and an impeller 23. The base 216 has one side, e.g. a bottom side of the base 216, provided with a circuit board 27, and another side, e.g. a top side of the base 216, provided with the stator 22 and the impeller 23. The stationary blades 217 are respectively connected at two ends to the frame 21 and the base 216, and are circumferentially spaced from one another. The conductor thin plates 25 can be thin metal plates or flat blade-like metal conductors, and are located between two adjacent stationary blades 217. Please refer to FIG. 3C. Each of the conductor thin plates 25 is extended across the airflow passage 213 and has a radially inner end 251, a radially outer end 252, and a upwind side 256 located between the inner end 251 and the outer end 252. The inner ends 251 of the conductor thin plates 25 are electrically connected to the circuit board 27 while the outer ends 252 of the conductor thin plates 25 are extended to the frame 21 to form metal contacts on an outer side of the frame 21, such that the conductor thin plates 25 are connected to between the circuit board 27 and the frame 21. Further, the conductor thin plates 25 located in the airflow passage 213 may be laterally spaced from each other or be vertically spaced from each other. Since the upwind side 256 of each of the conductor thin plates 25 is thin and flat and has a thickness of 0.3 mm only, which is much smaller than the outer diameter (i.e. the conductor size) of the prior art round conductor 131, the upwind side 256 of the conductor thin plate 25 provides a minimum area against the airflow flowing through the airflow passage 213 to thereby reduce the impact of the airflow on the conductor thin plate 25 and effectively reduce the fluid resistance in the airflow passage 213.

Further, each of the conductor thin plates 25 has a front surface 253 and a rear surface 254, which are located between the inner end 251 and the outer end 252. The front and the rear surface 253, 254 are in parallel with the flowing direction of the airflow in the airflow passage 213 without hindering the air from flowing. The front and the rear surface 253, 254 respectively have an area larger than the outer diameter (i.e. the conductor size) of the prior art round conductor 131 to give the conductor thin plate 25 an increased strength. With this arrangement, the conductor thin plate 25 is protected against deformation and has upgraded voltage adaptation, durability, and service life. Therefore, when the conductor thin plate 25 is applied to axial fan 2 of different sizes, only the areas of the front and the rear surface 253, 254 will be changed (such as by changing their length or height or both) while the thin and flat upwind side 256 is unchanged in thickness to always have a smallest possible area.

Please refer to FIG. 4 along with FIGS. 2, 3A and 3B. The outer end 252 of each of the conductor thin plates 25 is projected beyond and exposed from the outer side 212 of the frame 21 to form a metal contact, which is electrically connectable to an external conduction assembly 3. The external conduction assembly 3 includes a conductor portion 31 having an electrical connector 32 connected thereto. The electrical connector 32 has a docking surface 321 facing toward the outer side 212 of the frame 21 and being provided with a plurality of electrical contacts 322 corresponding to the outer ends 252 of the conductor thin plates 25. The electrical contacts 322 and the metal contacts formed by the outer ends 252 are in physical contact with one another to form an electrical connection.

Please refer to FIGS. 2, 3A and 4. In the illustrated embodiment of the present invention, a position on the outer side 212 of the frame 21 corresponding to the outer ends 252, such as, but not limited to, one of four corners of the frame 21, is provided with a recess 218 for the electrical connector 32 of the external conduction assembly 3 to fitly dock thereto. Further, joint structures, e.g. a protrusion and a corresponding hole, are separately provided on the electrical connector 32 and the recess 218 to ensure that the electrical connector 32 is tightly and firmly joined to the recess 218 without the risk of separating from the recess 218.

Figure 5A:
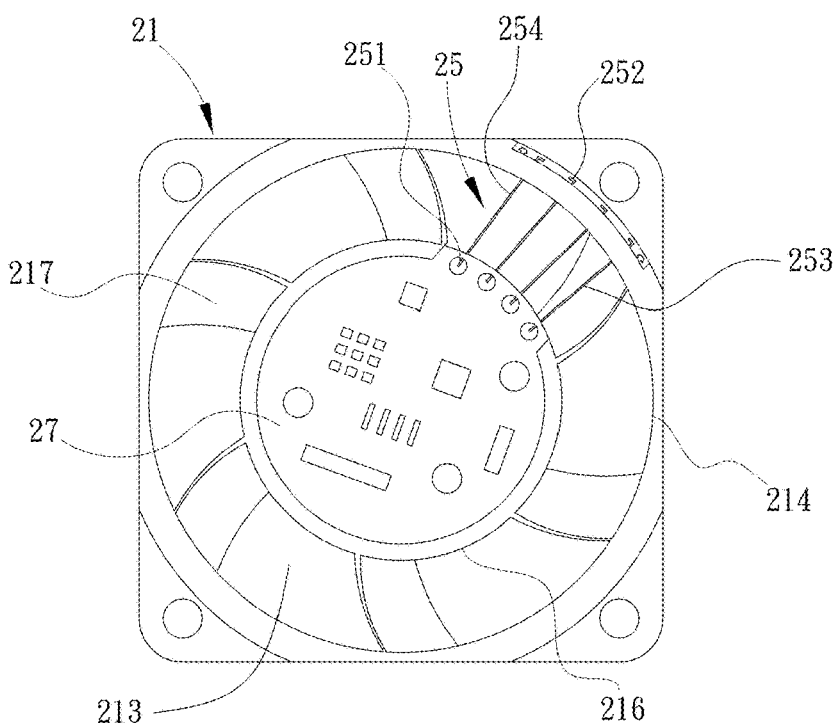
FIGS. 5A and 5B show different embodiments of the conductor thin plate of the present invention that are usable in an airflow passage of the axial fan.
Figure 5B:
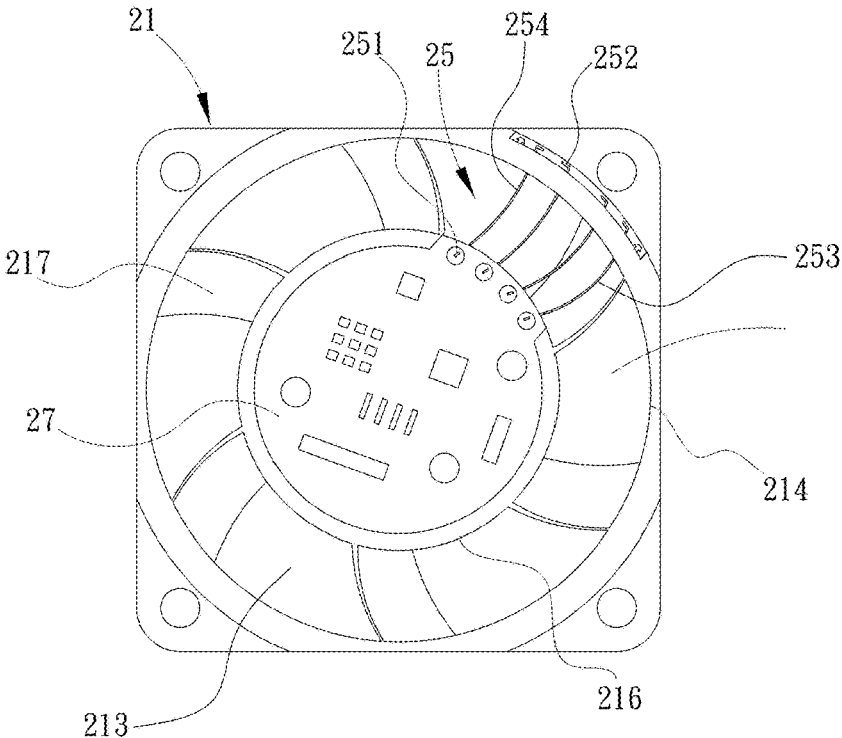

To more clearly depict the present invention, FIGS. 5A and 5B show only the frame 21, the circuit board 27, and the plurality of conductor thin plates 25 of the fan 2. Each of the conductor thin plates 25 may be a straight plate, as shown in FIG. 5A, or a curved plate, as shown in FIG. 5B.

Figure 6:
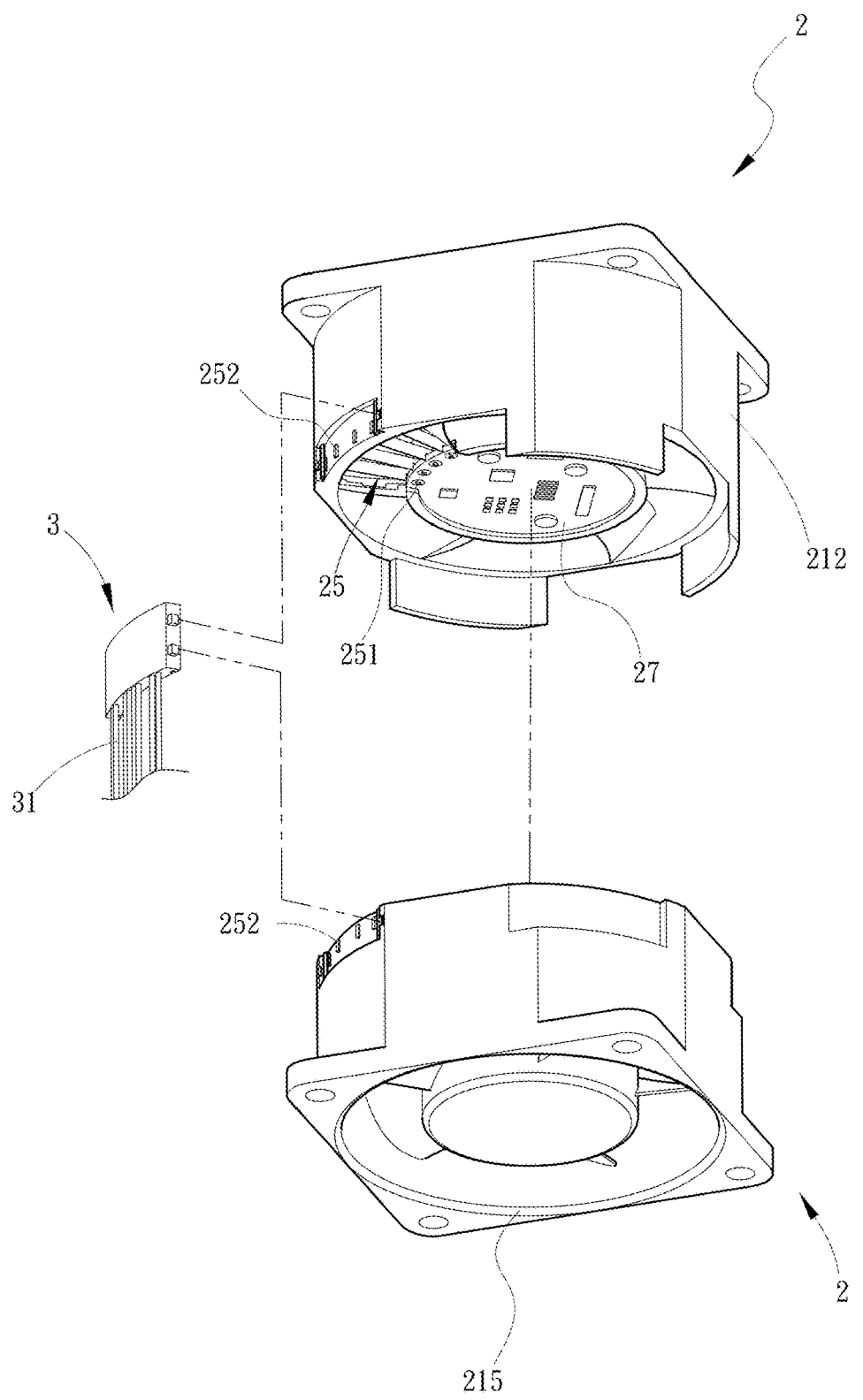
FIG. 6 shows the conducting plate structure according to the present invention is used with a serial fan.

Please refer to FIG. 6. The present invention is not necessarily restricted to be used with a single axial fan 2, but can also be used with a serial fan formed by two axial fans 2 connected in series. In this case, two sets of the conductor thin plates 25 on the two serially connected axial fans 2 are correspondingly located at an upper and a lower position. Similarly, the metal contacts formed by the outer ends 252 of the two sets of conductor thin plates 25 on the outer sides 212 of the frames 21 of the two axial fans 2 are also correspondingly located at an upper and a lower position. Then, only one single external conduction assembly 3 is needed to correspondingly contact with the outer ends 252 of the conductor thin plates 25 on the two axial fans 2 for the two axial fans 2 forming the serial fan to electrically connect with one another.

With the above arrangements, the conductor thin plates 25 according to the present invention are extended across the airflow passage 213. Since the conductor thin plates 25 have a thin and flat configuration that has a relatively small or narrow upwind side compared to the conventional round conductors 131, it is able to largely reduce the fluid resistance in the airflow passage 213, allowing the air to flow in the airflow passage 213 more smoothly without too much collision with the airflow passage 213. Meanwhile, the fan static pressure and output air volume can be increased and the noise produced by the fan in operation can be reduced.

The present invention has been described with some preferred embodiments thereof and it is understood that many changes and modifications in the described embodiments can be carried out without departing from the scope and the spirit of the invention that is intended to be limited only by the appended claims.

What is claimed is:

1. An electrical conducting plate structure for an axial fan including a frame internally defining an airflow passage; the airflow passage being internally provided with a base, a plurality of stationary blades, and a plurality of conductor plates; the base having one side provided with a circuit board; the stationary blades being spaced from one another and respectively having two ends connected to the frame and the base, and the conductor plates being located between two adjacent stationary blades to extend across the airflow passage; every conductor plate having a radially inner end electrically connected to the circuit board and a radially outer end extended to and beyond the frame to form a metal contact, and oriented such that a flat upwind side of the conductor plate in the airflow passage has an upwind area that presents a minimal airflow resistance.

2. The electrical conducting plate structure of claim 1, wherein the frame has an inner side and an outer side, and the inner side of the frame defining the airflow passage; and the outer end of each conductor plate being extended from the inner side to the outer side of the frame to form the metal contacts on the outer side of the frame.

3. The electrical conducting plate structure of claim 1, wherein the metal contacts are electrically connected to an external conduction assembly; the external conduction assembly including a conductor portion connected to an electrical connector; the electrical connector having a docking surface facing toward the outer side of the frame, and the docking surface having a plurality of electrical contacts provided thereon corresponding to the metal contacts.

4. The electrical conducting plate structure of claim 1, wherein the conductor plates arranged in the airflow passage are laterally spaced from one another.

5. The electrical conducting plate structure of claim 1, wherein the fan further includes an impeller, which is provided on another side of the base and located in the airflow passage.

6. The electrical conducting plate structure of claim 1, wherein each of the conductor plates has a front surface and a rear surface located between the inner end and the outer end of the conductor plate; the front and the rear surface of the conductor plate extending in a direction parallel to a flowing direction of the air in the airflow passage; and the flat upwind side being located between the inner end and the outer end of the conductor plate.

7. The electrical conducting plate structure of claim 1, wherein the frame has two open ends, which are an upper open end and a lower open end, respectively; and the upper and the lower open end being communicable with the airflow passage.

* * * * *